United States Patent [19]

Bargerhuff et al.

[11] Patent Number: 5,247,167
[45] Date of Patent: Sep. 21, 1993

[54] MULTIPLE BEAM POWER MONITORING SYSTEM AND METHOD WITH RADIATION DETECTION AND FOCUSING MEANS OF OVERLAPPING BEAMS

[75] Inventors: Richard A. Bargerhuff, Austin, Tex.; LeRoy D. Dickson, Morgan Hill, Calif.; John Groot, San Jose, Calif.; Melbourne E. Rabedeau, Saratoga, Calif.; James M. Zavislan, Auburn, N.Y.

[73] Assignee: International Business Machines Corporation, Armonk, N.Y.

[21] Appl. No.: 927,688

[22] Filed: Aug. 6, 1992

[51] Int. Cl.⁵ .......................................... H01J 40/14
[52] U.S. Cl. ................................. 250/208.1; 250/216; 250/205
[58] Field of Search ................ 250/205, 216, 208.2, 250/551; 356/222

[56] References Cited

U.S. PATENT DOCUMENTS

| | | | |
|---|---|---|---|
| 4,297,653 | 10/1981 | Scifres et al. | 331/94.5 |
| 4,660,983 | 4/1987 | Yamamoto et al. | 356/445 |
| 4,733,067 | 3/1988 | Oinoue et al. | 250/216 |
| 4,748,632 | 5/1988 | Preston | 372/32 |
| 4,829,533 | 5/1989 | Hallberg et al. | 372/29 |
| 4,877,311 | 10/1989 | Shernoff et al. | 356/350 |
| 5,012,081 | 4/1991 | Jungwirth et al. | 250/203.6 |
| 5,151,606 | 9/1992 | Grieve | 250/551 |
| 5,191,204 | 3/1993 | Dickerson et al. | 250/208.2 |

FOREIGN PATENT DOCUMENTS 1-160073 6/1989 Japan.
2-79483 3/1990 Japan.
0187716 7/1986 United Kingdom.

OTHER PUBLICATIONS

Katayama, et al., "Compact Optical Head Integrated With Chip Elements for CD-ROM Drives," 1992 Optical Data Storage Conference, San Jose.
IBM Technical Disclosure Bulletin, vol. 32, No. 8A, Jan. 1990, p. 149 "Vertically Emitting Diode Laser with Integrated Front-Beam Monitor Photodiode".
IBM Technical Disclosure Bulletin, vol. 27, No. 7B, Dec. 1984, p. 4344 "Photodiode Array for Monitoring Individual Lasers in a Laser Array".

Primary Examiner—David C. Nelms
Assistant Examiner—T. Davenport
Attorney, Agent, or Firm—Douglas R. Millett

[57] ABSTRACT

A multiple beam optical system includes a housing which contains a pair of laser diodes and a pair of optical detectors. The lasers produce overlapping beams of light. The housing includes a beam directing and reflecting member which selectively focuses light from one of the lasers to a corresponding optical detector located in the housing and selectively focuses light from the other laser to its corresponding optical detector located within the housing. The individual power of each of the overlapping laser beams is thereby monitored by the separate detectors.

22 Claims, 16 Drawing Sheets

MULTIPLE BEAM POWER MONITORING SYSTEM AND METHOD WITH RADIATION DETECTION AND FOCUSING MEANS OF OVERLAPPING BEAMS

BACKGROUND OF THE INVENTION

1. Field of the Invention

This invention relates generally to multiple beam optical systems and more particularly to a system for measuring the individual beam powers of overlapping beams.

2. Description of the Prior Art

Magneto-optic disk drives achieve high density data recording which is erasable. A write laser beam is focussed onto a spot on the medium and heats the magneto-optic material to a temperature above which the magnetization of the magnetic domains of the medium may be changed. A magnetic field is applied in one of two directions to orient the magnetic domains of the spot in either an upward or downward direction.

The disk is read by focussing a polarized read laser beam onto the magneto-optic material. The read laser beam has a lower power level than the write laser beam. The Kerr effect causes the reflected beam's plane of polarization to be rotated either clockwise or counterclockwise depending upon whether the spot has an upward or downward magnetic orientation. The difference in the rotation is detected and represents the recorded data.

The typical system uses one laser with variable power to do both writing and reading. In order to verify the data recorded, the disk must be rotated almost three times for each track recorded. One and one-half revolutions are required on average to seek and write the track, and a second revolution is required to read and verify the track just written.

In order to speed up the recording process, direct read after write (DRAW) systems have been proposed. The systems comprise two lasers; one laser (the Read/Write laser) to write a track and a second laser (the DRAW laser) to read the track directly after it has been written. Thus, the DRAW system requires only one and one half revolutions on average to write and verify a track on the disk. The Read/Write laser alone is used to read the disk when no writing function is being performed.

A problem with DRAW systems has been that the addition of the second laser beam greatly complicates the construction of the optical channel. The beams must be spaced close together in order to focus on the same track at the same time and to prevent aberration and truncation (beam obstruction) effects. However, this close spacing makes separation and power monitoring of each of the beams difficult.

Power monitoring schemes for lasers are shown in U.S. Pat. No. 4,829,533 issued May 9, 1989 to Hallberg, et al.; U.S. Pat. No. 4,877,311 issued Oct. 31, 1989 to Shernoff; U.S. Pat. No. 4,748,632 issued May 31, 1988 to Preston; U.S. Pat. No. 4,733,067 issued Mar. 22, 1988 to Oinoue, et al.; U.S. Pat. No. 4,660,983 issued Apr. 28, 1987 to Yamamoto, et al.; U.S. Pat. No. 4,297,653 issued Oct. 27, 1981 to Scifres, et al.; Japanese patent application 01-160073 published Jun. 22, 1989 by Kaneko, et al.; Japanese patent application 02-79483 published Mar. 20, 1990 by Shinoda, et al.; Research Disclosure 313107 published May 10, 1990; Research Disclosure 313101 published May 10, 1990; Research Disclosure 290086 published Jun. 10, 1988; Katayama, et al., "Compact Optical Head Integrated With Chip Elements for CD-ROM Drives," 1992 Optical Data Storage Conference, San Jose; IBM Technical Disclosure Bulletin, Vol. 32, No. 8A, January 1990, p. 149; IBM Technical Disclosure Bulletin, Vol. 27, No. 7B, December 1984, p. 4344; and European patent application 0187716, published Jul. 16, 1986 by Endo.

What is needed is a power monitoring scheme for measuring individual beam powers of overlapping beams.

SUMMARY OF THE INVENTION

In accordance with the invention, a first and a second diode lasers are located in a housing having a transparent coverplate. A first and a second optical detectors are also located within the housing. The coverplate contains a focussing reflector which reflects and focuses a portion of the light from the first laser to the first optical detector and reflects and focuses a portion of the light from the second laser to the second optical detector. The focussing reflector may be comprised of portions of ellipsoidal or spherical surfaces or a reflecting hologram. The power of each of the individual beams from the first and second lasers may thereby be determined. The resulting design allows for separate power monitoring of overlapping beams in a laser array in a very compact arrangement.

For a fuller understanding of the nature and advantages of the present invention, reference should be made to the following detailed description taken in conjunction with the accompanying drawings.

DESCRIPTION OF THE PREFERRED EMBODIMENTS

Figure 1:
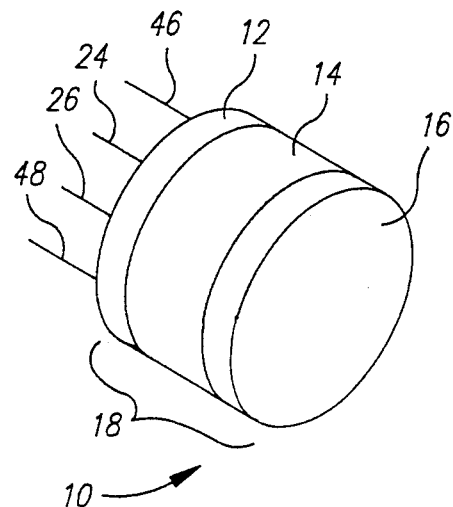
FIG. 1 is a perspective view of a laser system of the present invention.

FIG. 1 shows a perspective view of a laser system of the present invention and is designated by the general reference number 10. System 10 comprises a baseplate 12, a cylindrical side member 14, and a coverplate 16. Baseplate 12 is made of an electrically conductive material such as steel, copper or brass and member 14 may be made of a dielectric material. Coverplate 16 is made of a transparent material, preferably glass or plastic. Baseplate 12, member 14 and coverplate 16 may be bonded together to form a laser housing 18. Electrical leads are insulated from the baseplate 12. The baseplate 12 serves as the common ground. Alternatively, baseplate 12 may be made of a dielectric material and an additional common ground lead installed.

Figure 2:
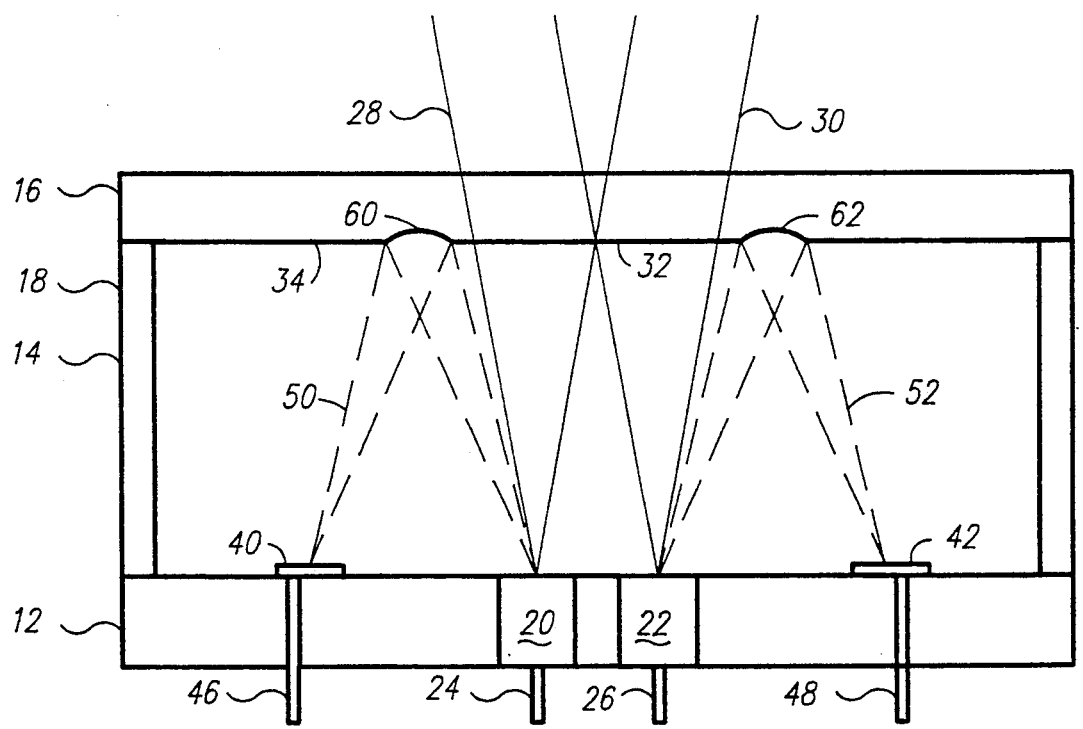
FIG. 2 is a cross-sectional view of the system of FIG. 1.

FIG. 2 shows a cross-sectional view of system 10. A pair of diode lasers 20 and 22 are mounted within baseplate 12 and have electrical leads 24 and 26, respectively. In a preferred embodiment, lasers 20 and 22 are gallium-aluminum-arsenide diode lasers which emit light at approximately 780 mm in wavelength. Lasers 20 and 22 are preferably separated by a distance which is large enough to allo the light from each laser to be separately focussed to the same track of an optical disk in a DRAW system, yet small enough so that there are no optical aberration problems. This distance is typically 25-200 micrometers.

Lasers 20 and 22 emit a pair of light beams 28 and 30, respectively. The light emitted has a Gaussian intensity distribution. Beams 28 and 30 represent the cross-sections of the beams at a radial position from the center of the beam where the intensity of the light is $e^{-2}$ the maximum intensity of the center of the beam. This is referred to as the $e^{-e}$ beam. This is the central and most useful portion of the light beam. The central portions of light beams 28 and 30 are allowed to pass through coverplate 16 and outside of system 10. An optional anti-reflective coating may be deposited on the inside surface and outside surface of coverplate 16 where beams 28 and 30 pass in order to eliminate any stray reflection of light. Anti-reflective coatings such as a three-layer coating may be used. These coatings are described in more detail by Angus Macleod, "Thin Film Optical Filters," McGraw Hill, N.Y., 1989, pp. 112-114.

A pair of optical detectors 40 and 42 are located on baseplate 12 and have electrical leads 46 and 48, respectively. Detectors 40 and 42 may be photodiodes. Lasers 20 and 22 emit a pair of peripheral beams 50 and 52, respectively. As used herein, peripheral beams 50 and 52 refer to that portion of the light from lasers 20 and 22 which lies outside of beams 28 and 30, respectively.

Surface 34 contains a pair of reflective focussing surfaces 60 and 62. The surfaces 60 and 62 are actually a portion of the surface of an elliposid or sphere or their close approximation. The surfaces are formed within coverplate 16 in an area outside of beams 28 and 30. Surface 60 collects peripheral light beam 50 from laser 20 and reflects and focuses it to detector 40. Surface 62 collects peripheral light beam 52 from laser 22 and reflects and focuses it to detector 42. The surfaces 60 and 62 selectively focus light from lasers 20 and 22 to separate detectors such that the overlapping light from the two lasers is separately detected at detectors 40 and 42. The amount of power of laser 20 is measured by the amount of light falling on detector 40 and the amount of power of laser 22 is measured by the amount of light falling on detector 42. There may be some amount of stray light which is randomly reflected to the wrong detector; however, because of the selective focussing of surfaces 60 and 62, the vast majority of light falling on each detector will be light from the desired laser.

Figure 3:
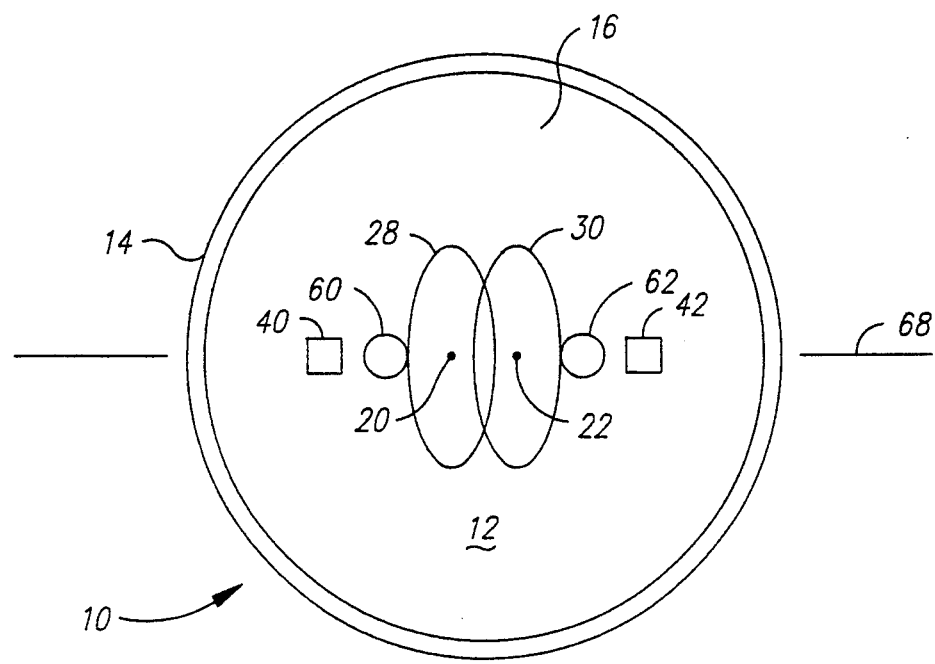
FIG. 3 is a top view of the system of FIG. 1.

FIG. 3 shows a top view of system 10 through coverplate 16. The beams 28 and 30 have an elliptical cross-section because they are produced by diode lasers in the preferred embodiment. A plane 68 passes through laser 20 and 22, detectors 40 and 42, and surfaces 60 and 62.

Figure 4:
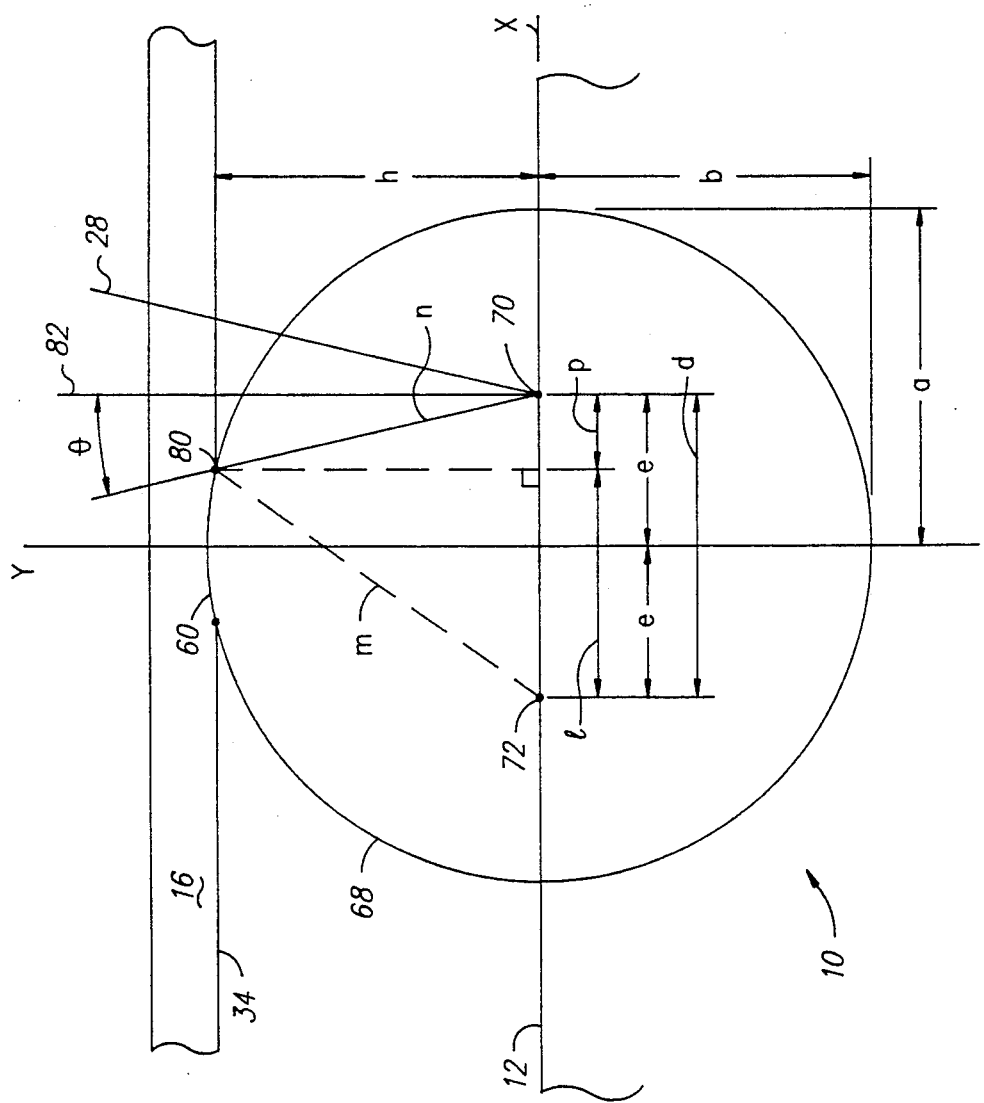
FIG. 4 is a diagram of an ellipsoidal surface.

FIG. 4 shows a diagram of the preferred ellipsoidal surface 60. One of the properties of an ellipse or ellipsoidal surface is that light from one focus point is reflected and focussed to the other focus point. In the preferred embodiment, surface 60 is shaped from an ellipsoid derived from an ellipse 68. Ellipse 68 has a first focus point 70 located at laser 20 and a second focus point 72 located at optical detector 40.

For purposes of illustration, the x-axis is shown as passing through foci 70 and 72 along the top surface of baseplate 12, and the y-axis is shown as located midway between foci 70 and 72. In the preferred embodiment, surface 60 is a portion of an elliposid centered between foci 70 and 72. A point 80 represents the point where the outer edge of beam 28 intersects the inner surface 34 of coverplate 16. Surface 60 begins at this point 80. Beam 28 has a center line 82 and the outer edge of beam 28 diverges from center line 82 at an angle $\theta$. Angle $\theta$ is the half-angle of the $e^{-2}$ beam envelope and is approximately 8° in the preferred embodiment. Given the angel $\theta$, the distance d between laser 20 and detector 40, and the height h from the upper surface of baseplate 12 to the lower surface 34 of coverplate 16, the desired formulas for the ellipse 68 may be determined.

$$\frac{x^2}{a^2} + \frac{y^2}{b^2} = 1$$

$$e = \sqrt{a^2 - b^2}$$

$$m + n = 2a$$

In these formulas, a is the semi-major axis and b is the semi-minor axis of elliposid 68, e is the distance from the origin to the foci, d=2e is the distance between the foci along the x-axis, m is the distance from point 72 to point 80, n is the distance from point 80 to point 70, 1 is the distance from point 72 along the x-axis to the vertical intersection of a line through point 80, and p is the distance along the x-axis from point 70 to a vertical line from point 80. Solving for a and b using the formulas above, we obtain the following:

$$p = h \tan\theta$$

$$l = d - p$$

$$n = h \div \cos\theta$$

$$m = \sqrt{l^2 + h^2}$$

-continued
$$a = \frac{m+n}{2}$$

$$b = \sqrt{a^2 - \left(\frac{d}{2}\right)^2}$$

Once the formula for ellipse 68 is determined from the above formulas, surface 60 is generated by rotating ellipse 68 around the x-axis to obtain the ellipsoid. This surface 60 may be formed into coverplate 16 by a stamping process at the time of manufacture or it may be machined out of coverplate 16 and polished. The surface 62 is determined and made in a manner similar to that described for surface 60, except that the two foci are located at laser 22 and optical detector 42.

Figure 5:
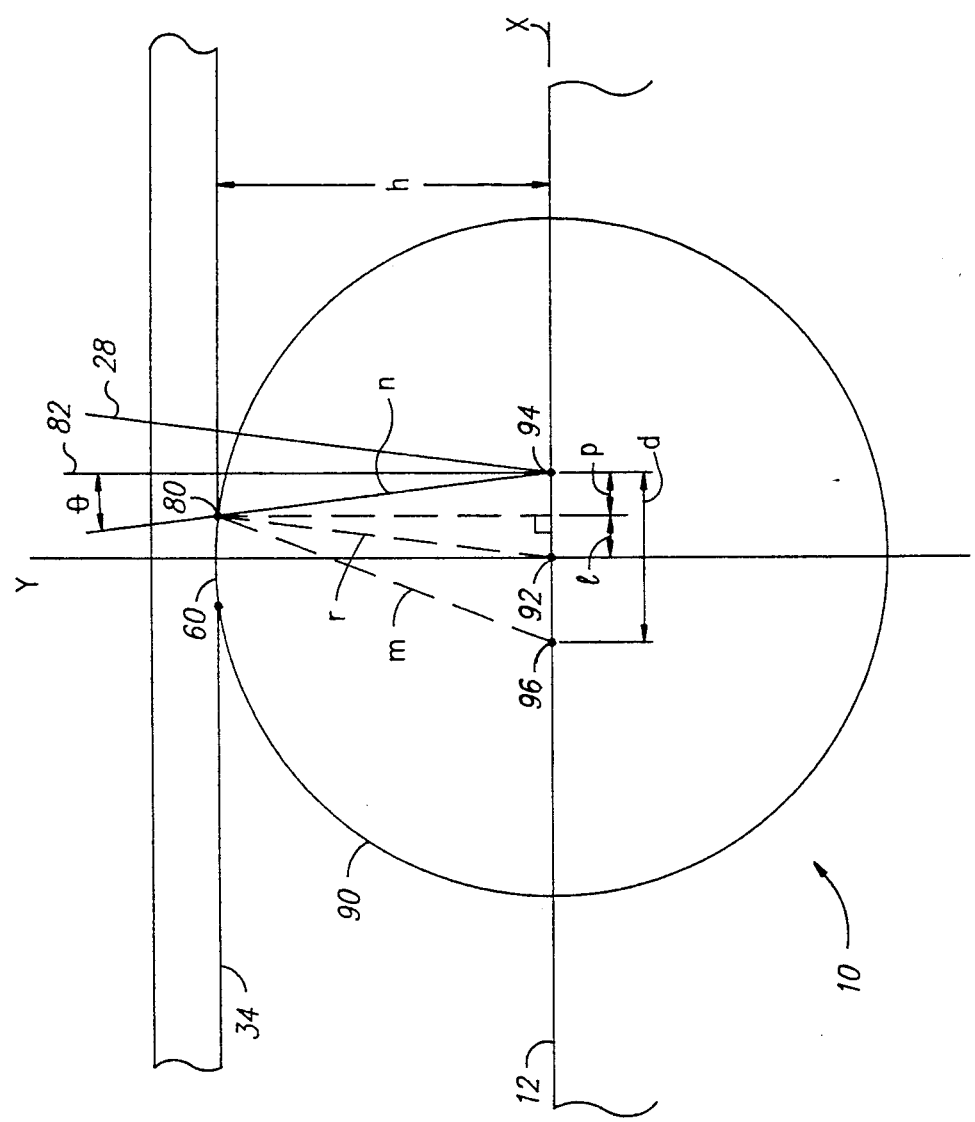
FIG. 5 is a diagram of a spherical surface.

FIG. 5 shows a diagram of an alternative embodiment to surface 60. Here surface 60 is formed from a spherical surface generated from a circle 90. A spherical surface is a good approximation of an ellipsoidal surface and may be easier to manufacture.

Circle 90 has a center point 92 located midway between a point located at laser 20 and a point 96 located at optical detector 40. The equation for circle 90 is $$x^2 + y^2 = r^2, \text{ where } r = \sqrt{h^2 + l^2}, \text{ and } l = \frac{d}{2} - h\tan\theta.$$

The spherical surface 60 is obtained by rotating the circle 90 about the x-axis. This spherical surface 60 may be stamped into coverplate 16 or may be machined out. The spherical surface is easier to manufacture because it is symmetrical and may be drilled out in a simple drilling process. This spherical surface will approximate the ellipsoidal surface and focus light from laser 20 at point 94 to optical detector 40 at point 96. The other surface 62 may also be spherical and is determined and made in a manner similar to that described for surface 60.

In the case of perfect imaging, as with the ellipsoidal surface as described in FIG. 4, the light will fall as a small circular spot on the detector. The spherical surface is a good approximation of the ellipsoidal surface, however, the imaging is not perfect. In the spherical surface embodiment described in FIG. 5, the light will fall as an oblong or oval shape on the detector. This oval will have its long axis parallel to the x-axis and its short axis parallel to the z-axis, where the z-axis is perpendicular to the page of FIG. 5. This is known as a sagittal focus. This oblong shape will ordinarily not cause any problems. However, if it is desired, this image spot can be changed by modifying the curvature of the spherical surface slightly. This is done by increasing the radius of the circle slightly. For example, increasing the radius of curvature of surface 60 by approximately 5% over the radius calculated in the description of FIG. 5, will result in a roughly circular spot falling upon the detector. Increasing the radius of curvature by approximately 10% over that described in FIG. 5 will result in an oval image spot falling on the detector. This oval spot will have its long axis parallel to the z-axis and its short axis parallel to the x-axis. This is known as the tangential focus. In these examples, the radius of curvature of surface 60 is increased, but the surface itself is still contained between points 60 and 80 as shown in FIG. 5. In effect, the center point 92 of the circle is now located below the surface of baseplate 12 in these increased radius embodiments.

Figure 6:
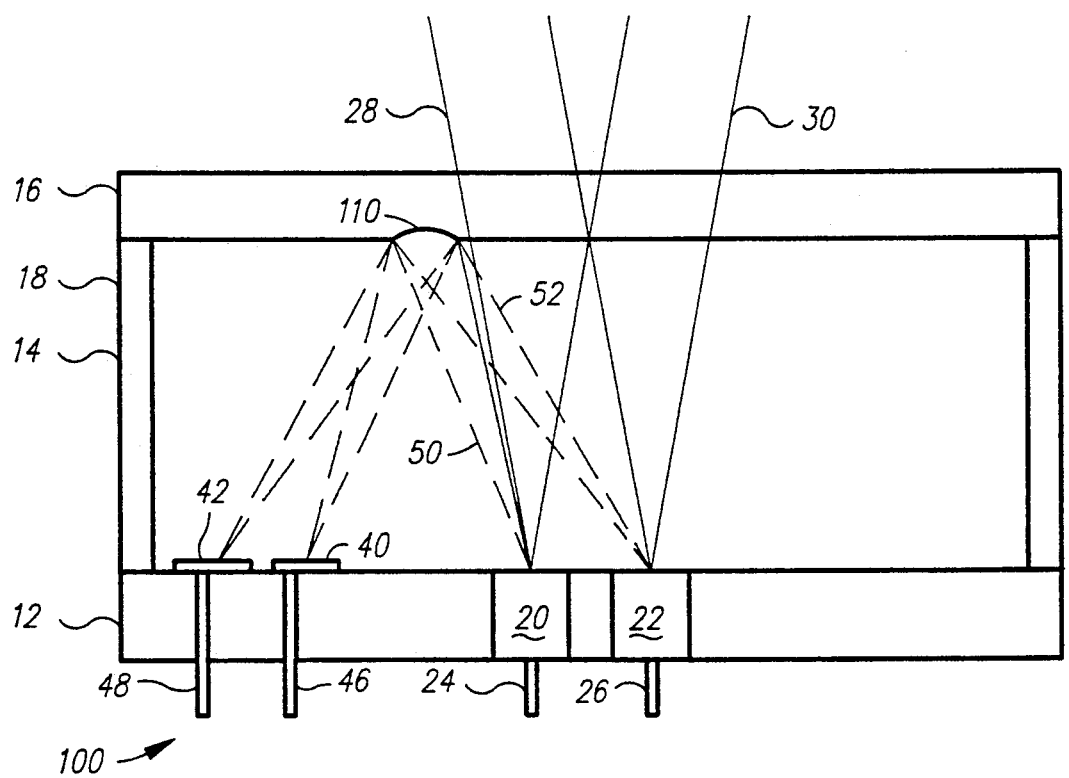
FIG. 6 is a cross-sectional view of an alternative embodiment of the present invention.

FIG. 6 shows a cross-sectional view of an alternative embodiment of the system of the present invention and designated by the general reference number 100. System 100 is similar to system 10, except that there is a single reflective focussing surface 110 and detectors 40 and 42 are located on the same side of the lasers 20 and 22. Surface 110 reflects and focuses beam 50 from laser 20 to detector 40 and reflects and focuses beam 52 from laser 22 to detector 42. The focussing is not perfect because the lasers and detectors are not located exactly at the foci as in system 10, however, the focussing is substantial enough to achieve good power monitoring.

Figure 7:
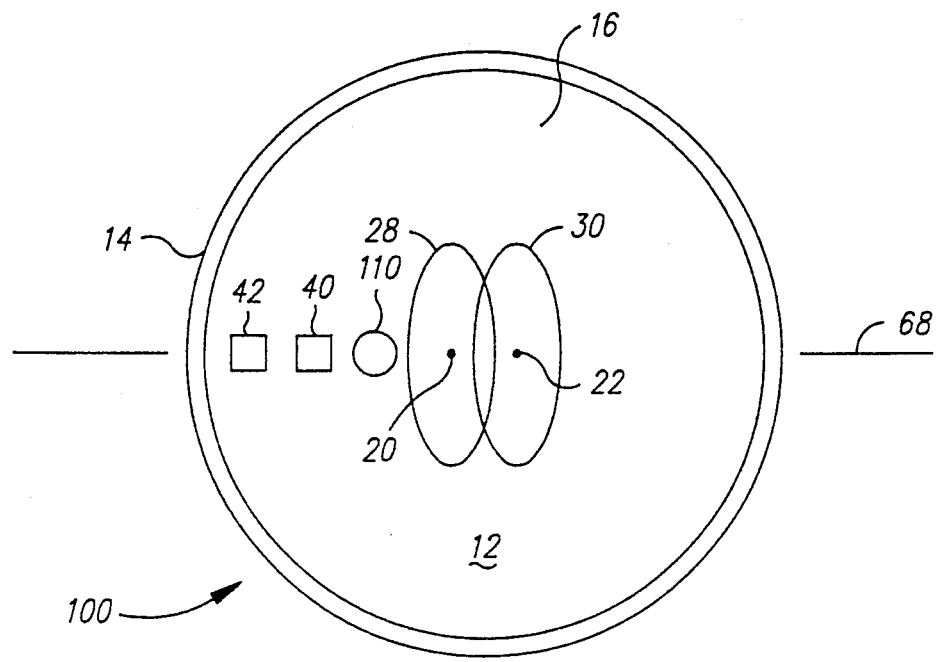
FIG. 7 is a top view of the system of FIG. 6.

FIG. 7 shows a top view of system 100. Lasers 20 and 22, detectors 40 and 42, and surface 110 are all centered along plane 68.

Figure 8:
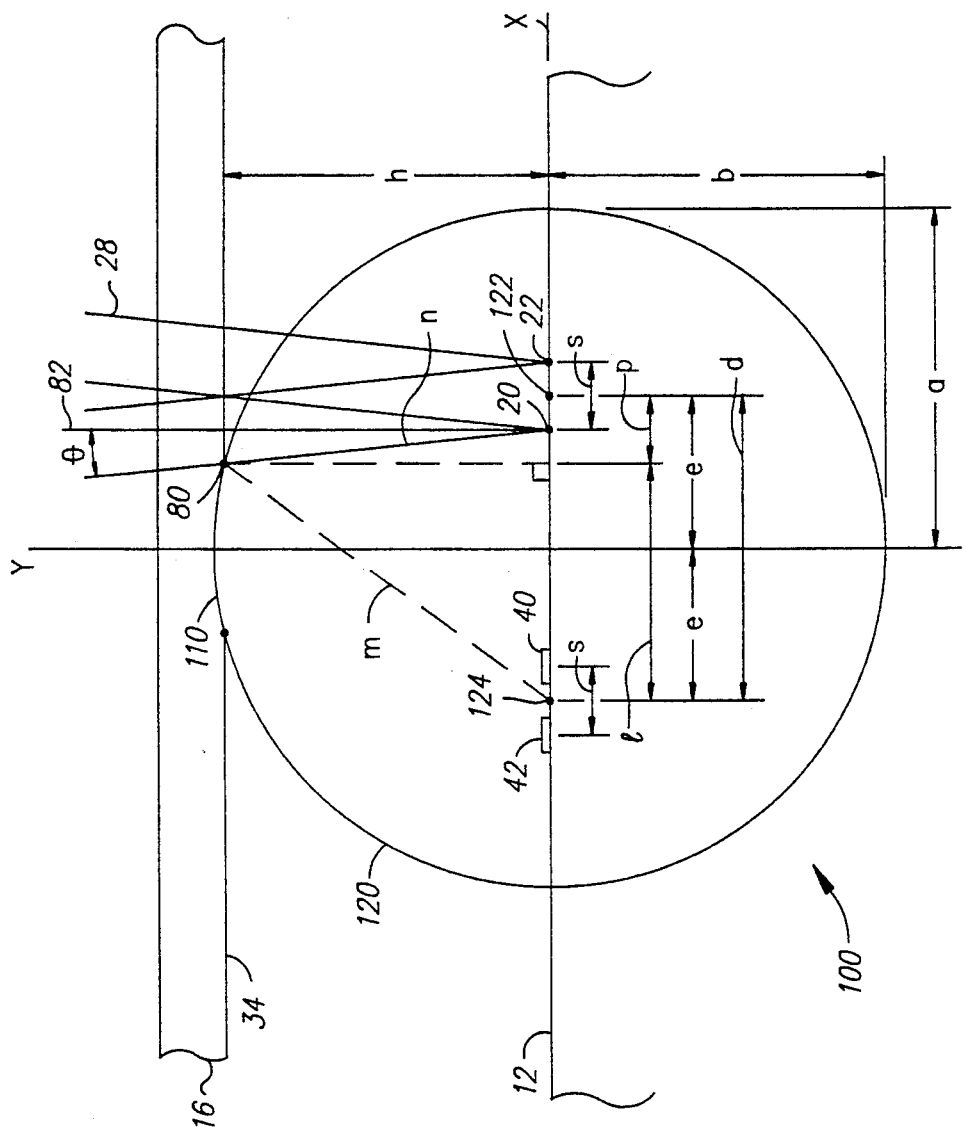
FIG. 8 is a diagram of an ellipsoidal surface.

FIG. 8 shows a diagram of the ellipsoidal surface 110. Surface 110 is formed from ellipse 120. Ellipse 120 has a first focus point 122 located midway between lasers 20 and 22, and a second focus point 124 located midway between detectors 40 and 42. In the preferred embodiment, the distance s between lasers 20 and 22 is the same as the distance between detectors 40 and 42. Points 124 and 122 are a distance d apart. The equation for ellipse 120 is the same as that described for ellipse 68 of FIG. 4, except that here $p = h\tan\theta + s/2$ and $l = d - p$.

Figure 9:
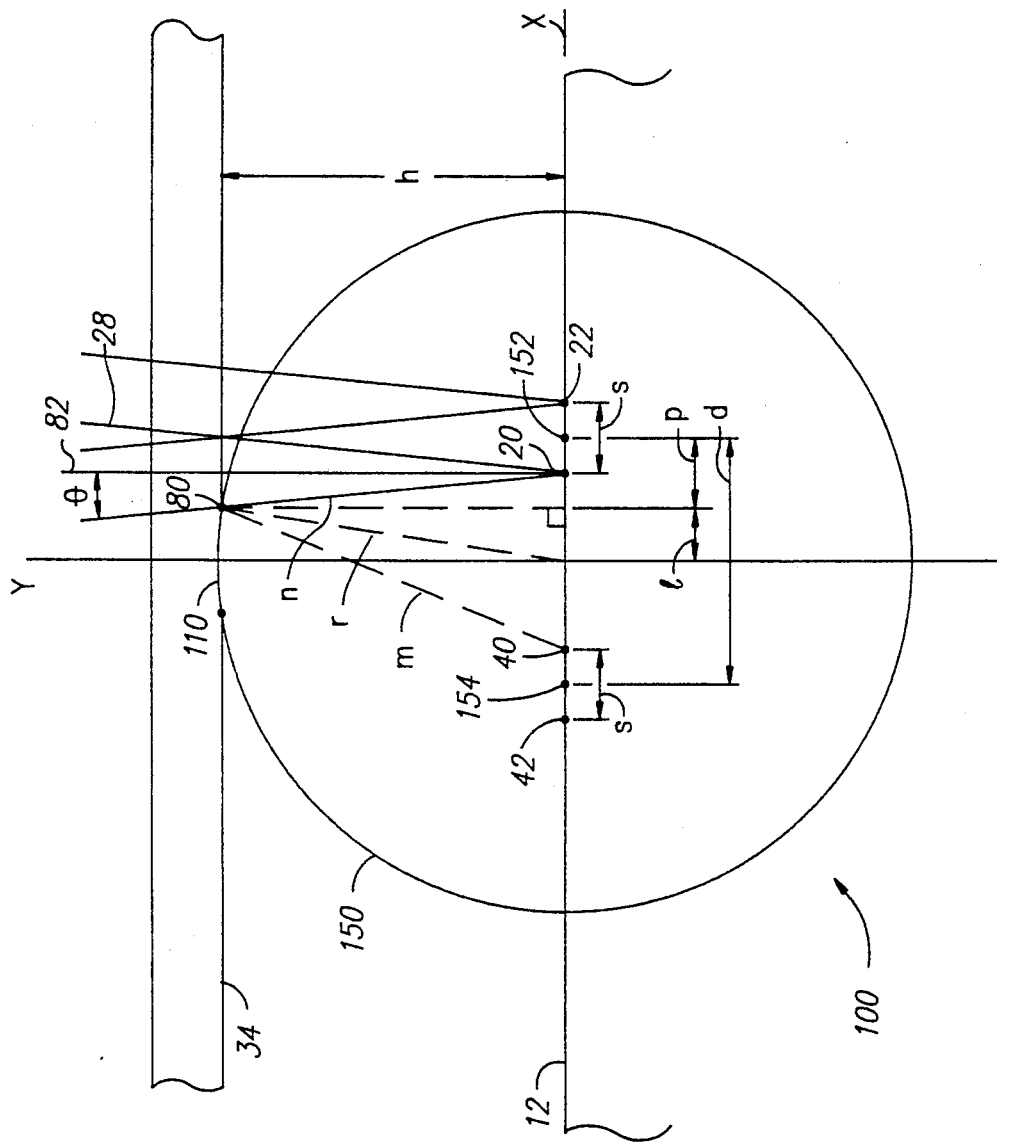
FIG. 9 is a diagram of a spherical surface.

FIG. 9 shows a diagram of an alternative embodiment of surface 110. Here surface 110 is a spherical surface formed by a circle 150. A point 152 is located midway between lasers 20 and 22, and a point 154 is located midway between detectors 40 and 42. The equation for the circle is the same as that described for circle 90 of FIG. 5 except that here $l = d/2 - h\tan\theta - s/2$. The focussing is not perfect in this embodiment since the spherical surface is an approximation of an ellipsoidal surface and the lasers and detectors are not located exactly at the points 152 and 154 which approximate the foci. However, the focussing is efficient enough to obtain good beam separation for power monitoring purposes.

Figure 10:
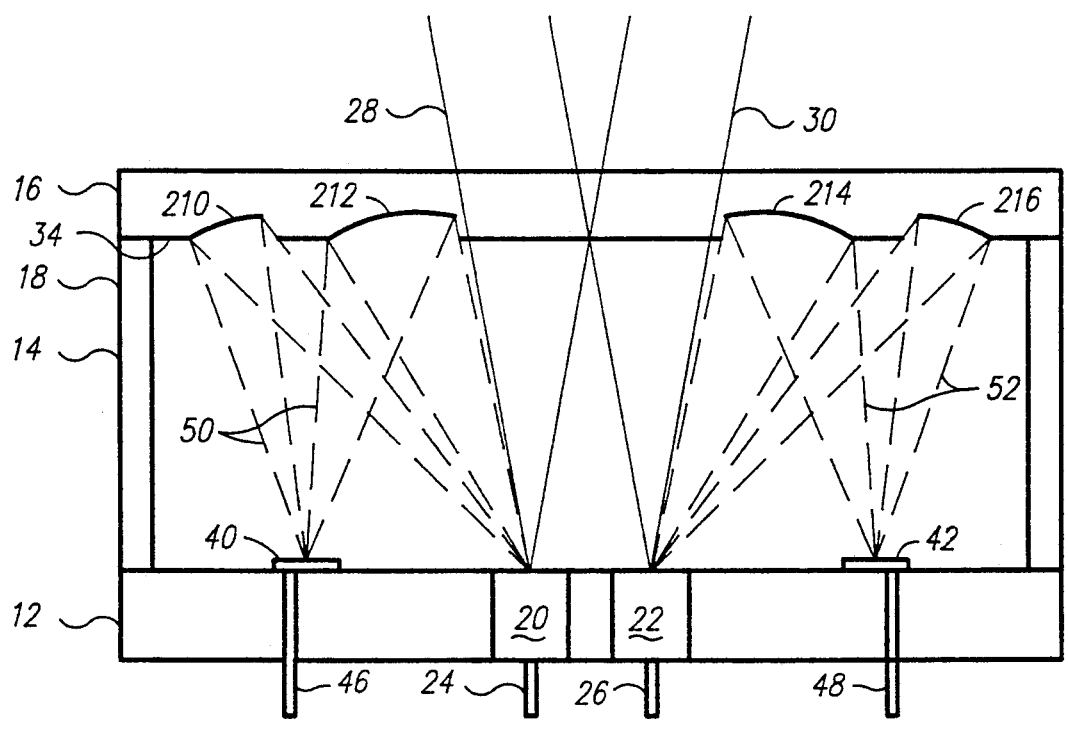
FIG. 10 is a cross-sectional view of an alternative embodiment of the present invention.

FIG. 10 shows a cross-sectional view of an alternative embodiment of the system of the present invention and is designated by the general reference number 200. System 200 has a number of reflective focussing surfaces 210, 212, 214 and 216. Surfaces 210 and 212 reflect and focus beam 50 from laser 20 to detector 40. Surfaces 214 and 216 reflect and focus beam 52 from laser 22 to detector 42.

Figure 11:
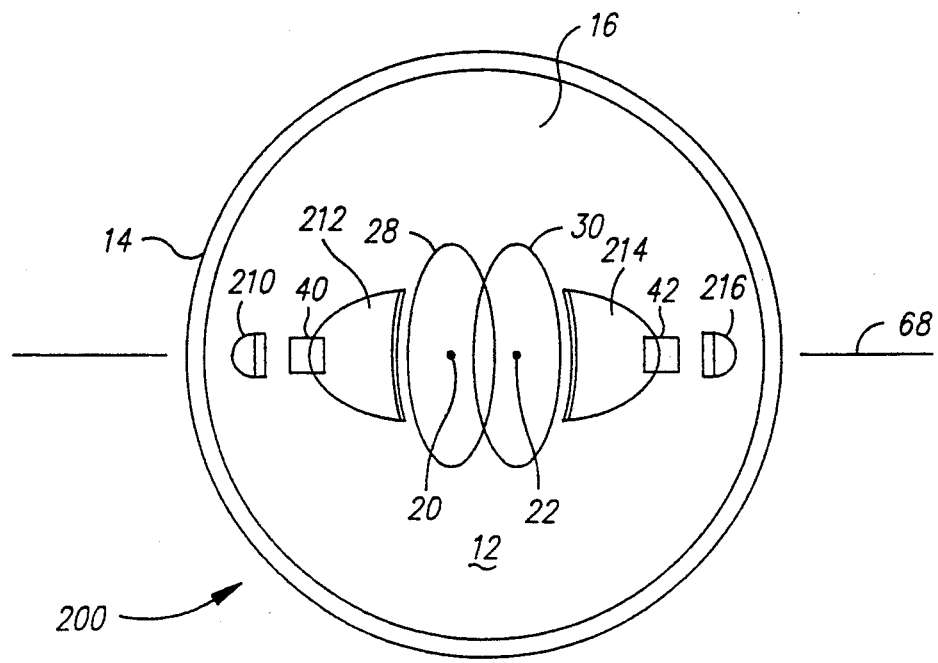
FIG. 11 is a top view of the system of FIG. 10.

FIG. 11 shows a top view of system 200.

Figure 12:
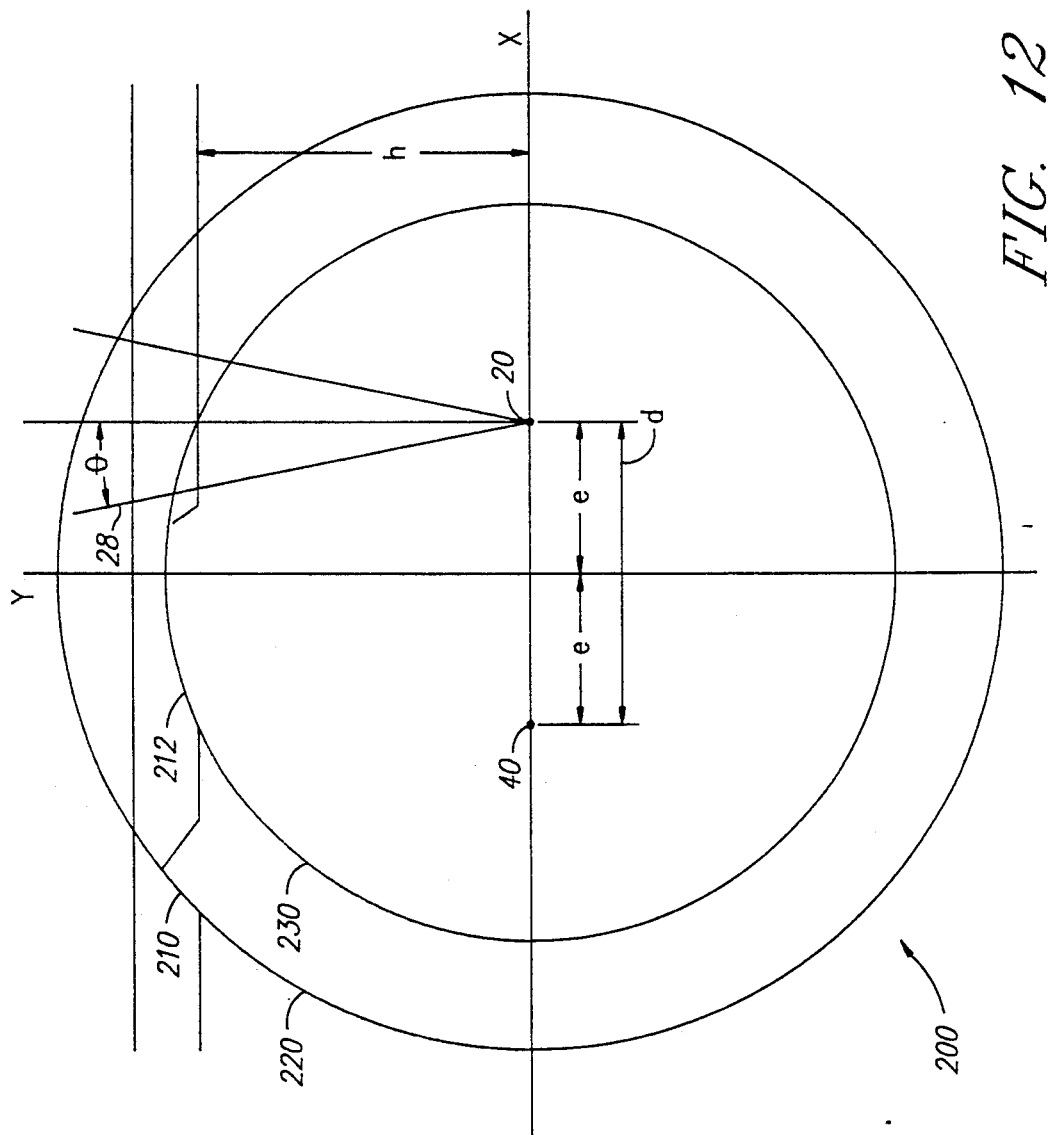
FIG. 12 is a diagram of two ellipsoidal surfaces.

FIG. 12 shows a diagram of surfaces 210 and 212 of system 200. Surface 210 is formed by an ellipse 220 and surface 212 is formed by an ellipse 230. Both ellipses 220 and 230 have foci at laser 20 and detector 40. The surfaces 210 and 212 are formed by rotating ellipses 220 and 230, respectively, about the x-axis. As can be seen, there are a large variety of ellipsoidal surfaces which may be used. The only requirements are that the foci be at laser 20 and detector 40 and that the surfaces not fall within the beams 28 and 30. The surfaces 214 and 216 are similarly formed by ellipses having foci at laser 22 and detector 42.

Figure 13:
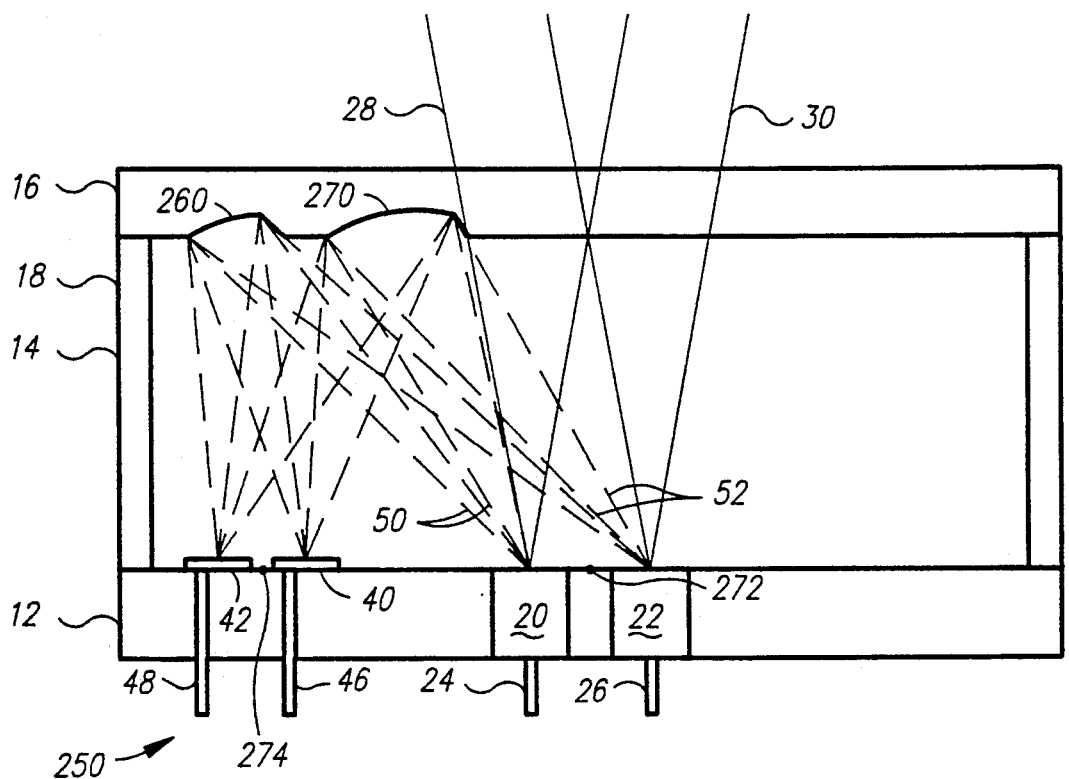
FIG. 13 is a cross-sectional view of an alternative embodiment of the present invention.

FIG. 13 shows a cross-sectional view of an alternative embodiment of the system of the present invention and is designated by the general reference number 250. System 250 has a pair of reflective focussing surfaces 260 and 270. Both surfaces 260 and 270 are formed from ellipses having foci at points 272 and 274. Point 272 is midway between lasers 20 and 22, and point 274 is midway between detectors 40 and 42. The result is that surface 260 reflects and focuses beam 50 from laser 20 to detector 40, and beam 52 from laser 22 to detector 42. Similarly, surface 270 reflects and focuses beam 50 from Laser 20 to detector 40 and beam 52 from laser 22 to detector 42. The focussing is not perfect because the foci are not located exactly at the detectors or the lasers, however, the focussing is good enough to separate the light beams to the desired detectors. Although system 250 shows both surfaces 260 and 270 for purposes of illustration, either surface could be used alone. There are a large number of other ellipsoidal surfaces which could also be used.

Figure 14:
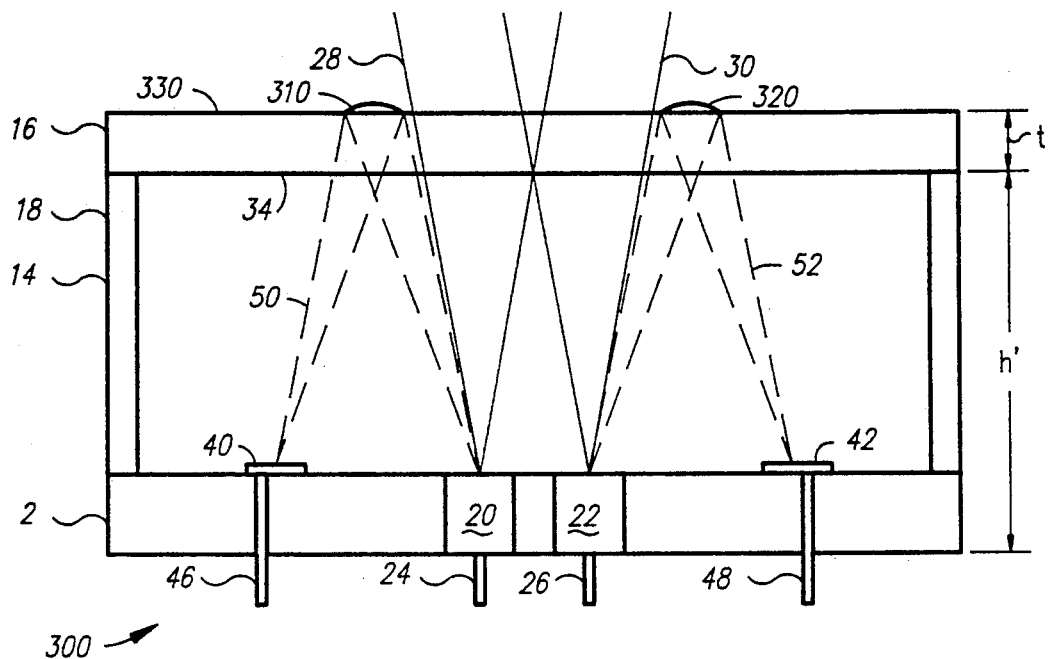
FIG. 14 is a cross-sectional view of an alternative embodiment of the present invention.

FIG. 14 shows a cross-sectional view of an alternative embodiment of the system of the present invention and is designated by the general reference number 300. System 300 has a pair of reflecting surfaces 310 and 320 located on the top surface 330 of coverplate 16. Surfaces 310 and 320 are similar to surfaces 60 and 62, respectively of system 10. The shapes of surfaces 310 and 320 are determined similar to the ellipsoidal surfaces 60 and 62. The equations for system 10 may be used after taking into account the refraction experienced by the light at coverplate 16. The new equations for h, a and b are as follows:

$$h = h' + \left(\frac{t}{n_c}\right)$$

$$a = n_c\left(\frac{m+n}{2}\right)$$

$$b = n_c\sqrt{a^2 - \left(\frac{d}{2}\right)^2}$$

In these equations, h' is the distance between the coverplate 16 and baseplate 12, t is the thickness of coverplate 16, and $n_c$ is the index of refraction of the coverplate 16. The other equations remain the same. Coverplate 16 is preferably approximately 0.2 mm in thickness.

Alternatively, reflecting surfaces 310 and 320 could be made similar to the spherical surfaces 60 and 62, respectively, of system 10. The equation stated above for the spherical surface may also be used, after modification to take into account the refraction at the coverplate 16. The following equations may be used:

$$h = h' + \frac{t}{n_c}$$

$$r = n_c\sqrt{h^2 + l^2}$$

Surfaces 310 and 320 may be integrally formed by stamping them into coverplate 16. Alternatively, a clear polymer such as photo-enable epoxy may be molded into the desired shape on top of coverplate 16. Preferably the polymer should have an index of refraction approximately equal to the index of refraction of coverplate 16 in order to reduce any unwanted stray reflection.

Figure 15:
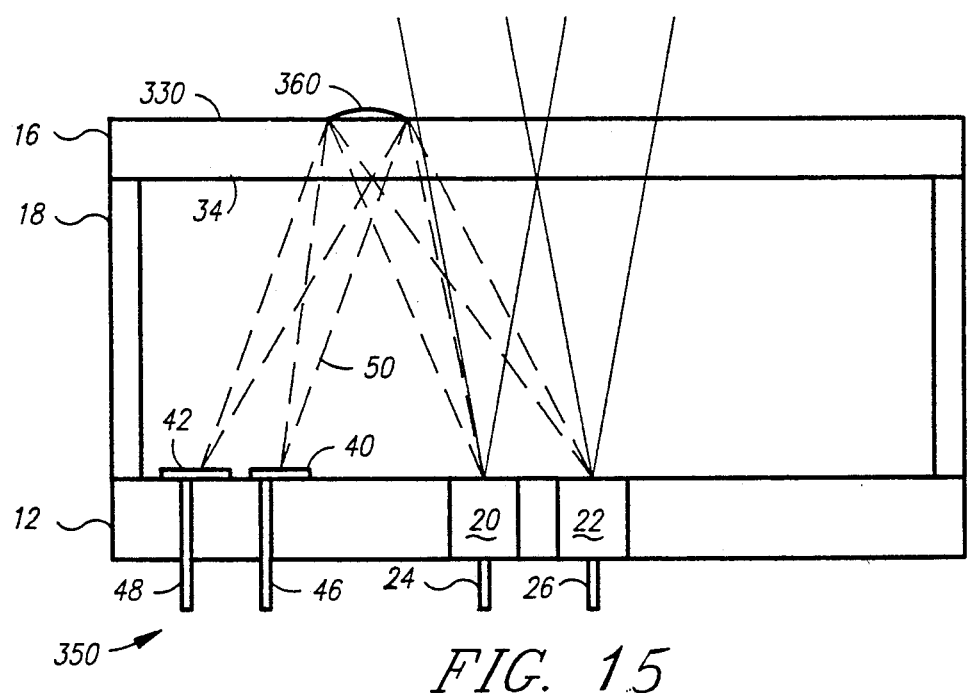
FIG. 15 is a cross-sectional view of an alternative embodiment of the present invention.

FIG. 15 shows a cross-sectional view of an alternative embodiment of the system of the present invention and is designated by the general reference number 350. System 350 has a single reflective focussing surface 360. The shape of surface 360 is similar to surface 110 of system 100. The same equations may be used except that h now includes the thickness of coverplate 16. Surface 360 is made similar to surfaces 310 and 320 of system 300.

Figure 16:
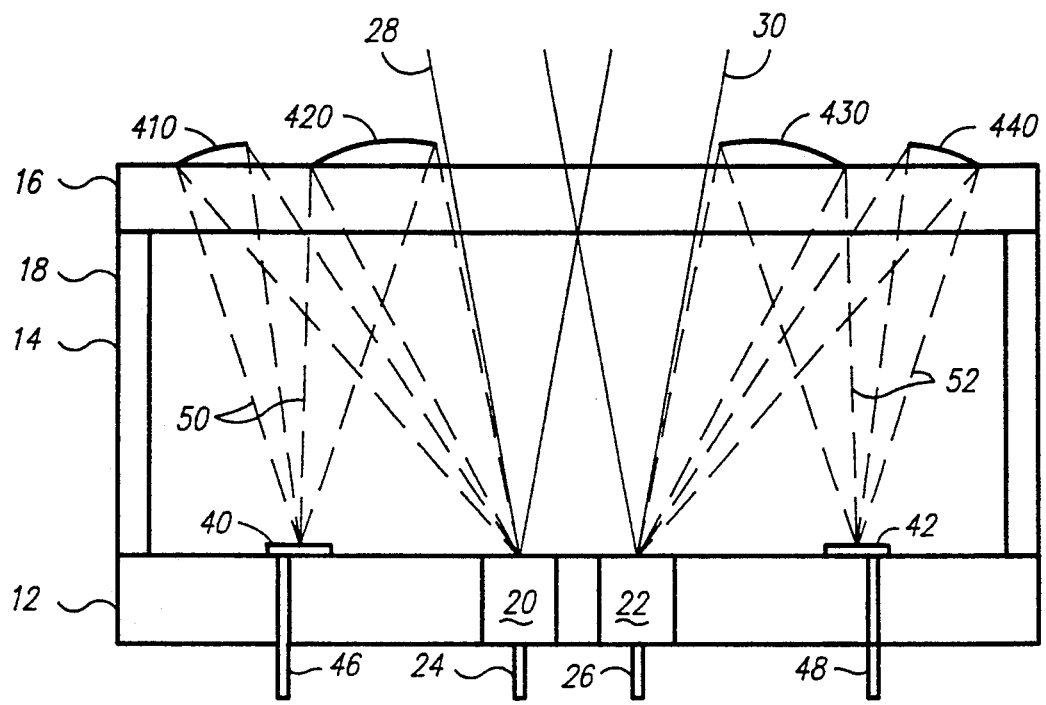
FIG. 16 is cross-sectional view of an alternative embodiment of the present invention.

FIG. 16 is a cross-sectional view of an alternative embodiment of the system of the present invention and is designated by the general reference number 400. The system 400 has a number of reflective focussing surfaces 410, 420, 430 and 440 which have shapes similar to surfaces 210, 212, 214 and 216, respectively of system 200. These surfaces 410, 420, 430 and 440 are made similar to surfaces 310 and 320 of system 300.

Figure 17:
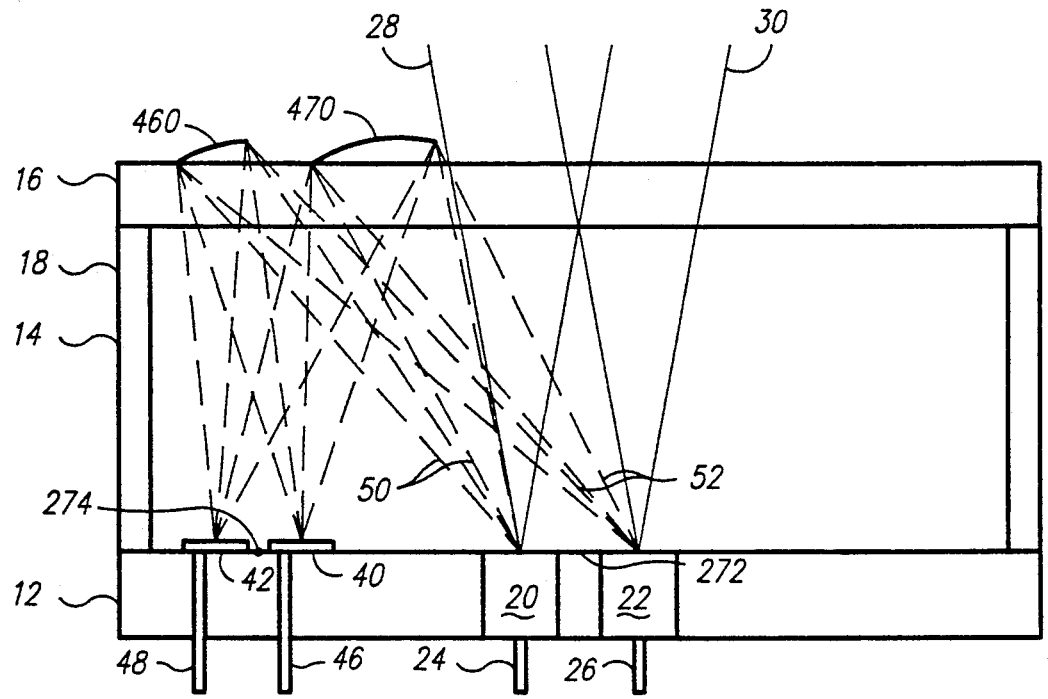
FIG. 17 is a cross-sectional view of an alternative embodiment of the present invention.

FIG. 17 shows a cross-sectional view of an alternative embodiment of the system of the present invention and is designated by the general reference number 450. System 450 has a pair reflective focussing surfaces 460 and 470 which are similar in shape to surfaces 260 and 270 of system 250. Surfaces 460 and 470 are made similar to surfaces 310 and 320 of system 300.

In all of the embodiments described thus far, adequate reflection is achieved at the focussing reflective surfaces by means of internal reflection. This means that ordinarily there is no need for a reflective coating. However, in cases where it is desired to increase the reflection efficiency of the surfaces, a reflective coating such as aluminum may be deposited on the focussing reflective surfaces.

Figure 18:
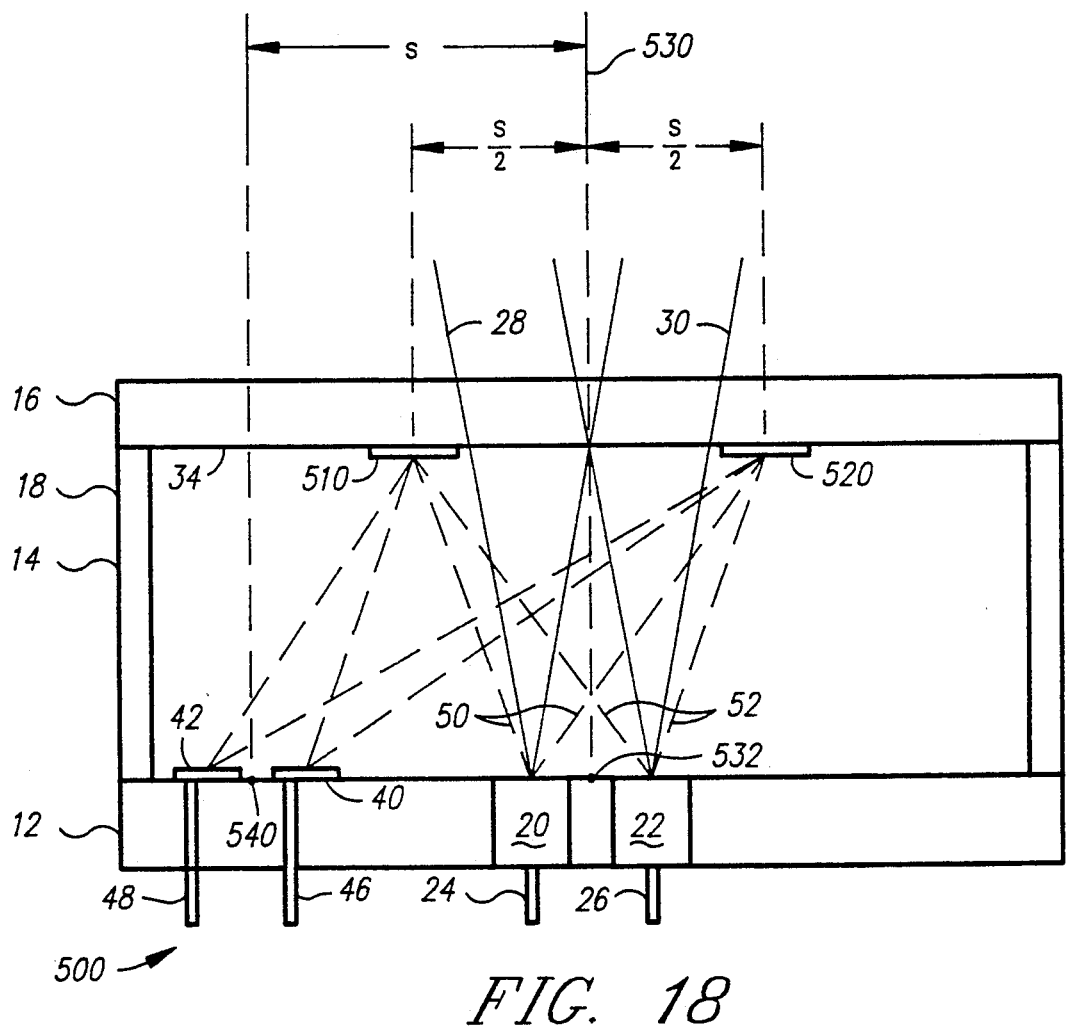
FIG. 18 is a cross-sectional view of an alternative embodiment of the present invention.

FIG. 18 shows a cross-sectional view of an alternative embodiment of the system of the present invention and is designated by the general reference number 500. In system 500 a pair of holograms 510 and 520 are located on lower surface 34 of coverplate 16. Holograms 510 and 520 both reflect and focus light from laser 20 to detector 40, and reflect and focus light from laser 22 to detector 42. In a preferred embodiment, holograms 510 and 520 are two portions of a single zoneplate hologram which is centered around axis 530. Zoneplate holograms are known in the art and are described in further detail in H. J. Caulfield, "Handbook of Optical Holography," Academic Press, 1979. Axis 530 passes through a point 532 which is located midway between lasers 20 and 22. A point 540 is located midway between detectors 40 and 42. The distance separating lasers 20 and 22 is equal to the distance separating detectors 40 and 42. The distance from point 532 to 540 is equal to s. The individual centers of holograms 510 and 520 are each located a distance s/2 away from axis 530. Holograms 510 and 520 may be made by photopolymer or e-beam processes as are known in the art.

Figure 19:
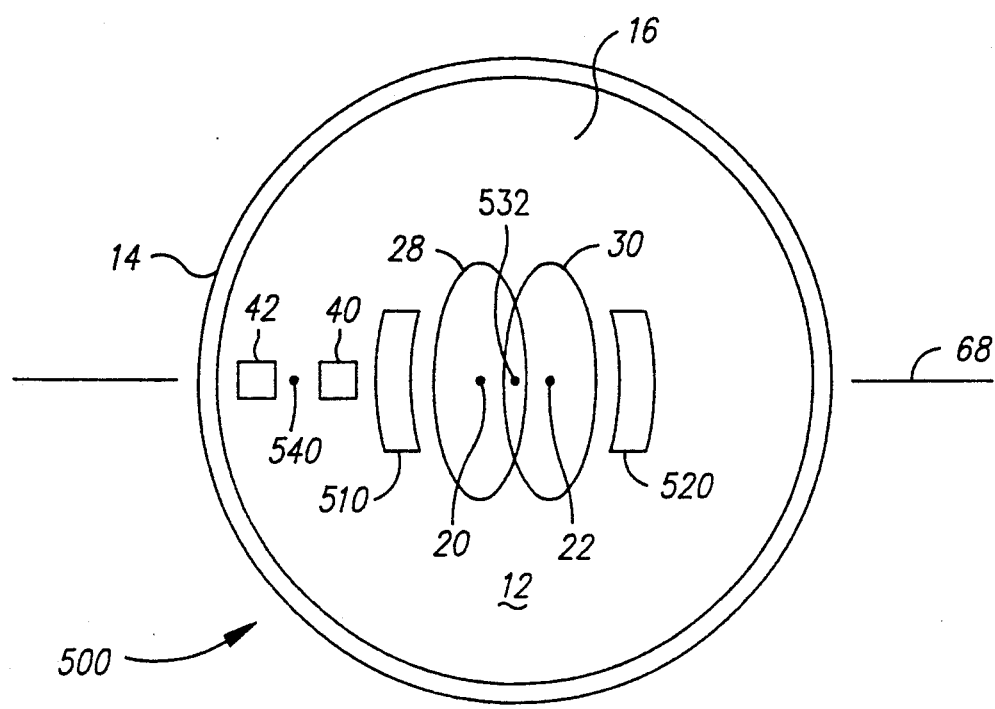
FIG. 19 is a top view of the system of FIG. 18.

FIG. 19 shows a top view of the system 500. Lasers 20 and 22, holograms 510 and 520, and detectors 40 and 42 are all centered along plane 68.

Figure 20:
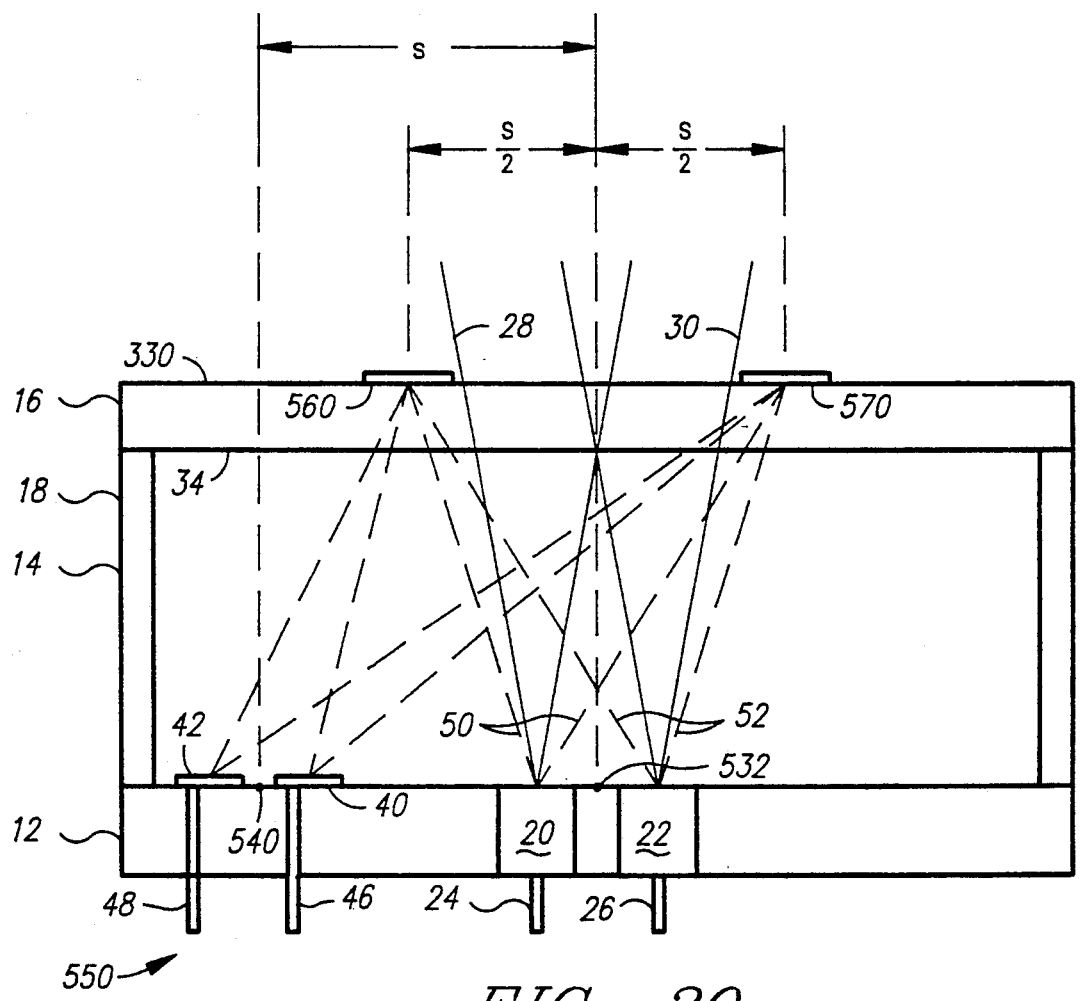
FIG. 20 is a cross-sectional view of an alterantive embodiment of the present invention.

FIG. 20 shows a cross-sectional view of an alternative embodiment of the system of the present invention and is designated by the general reference number 550. System 550 has a pair of holograms 560 and 570 similar to holograms 510 and 520 of system 500. Holograms 560 and 570 are located on the top surface 330 of coverplate 16. There may be some refraction of light at surface 34, but this can be corrected by taking into account the amount of refraction in a manner similar to that described in connection with FIG. 14.

Figure 21:
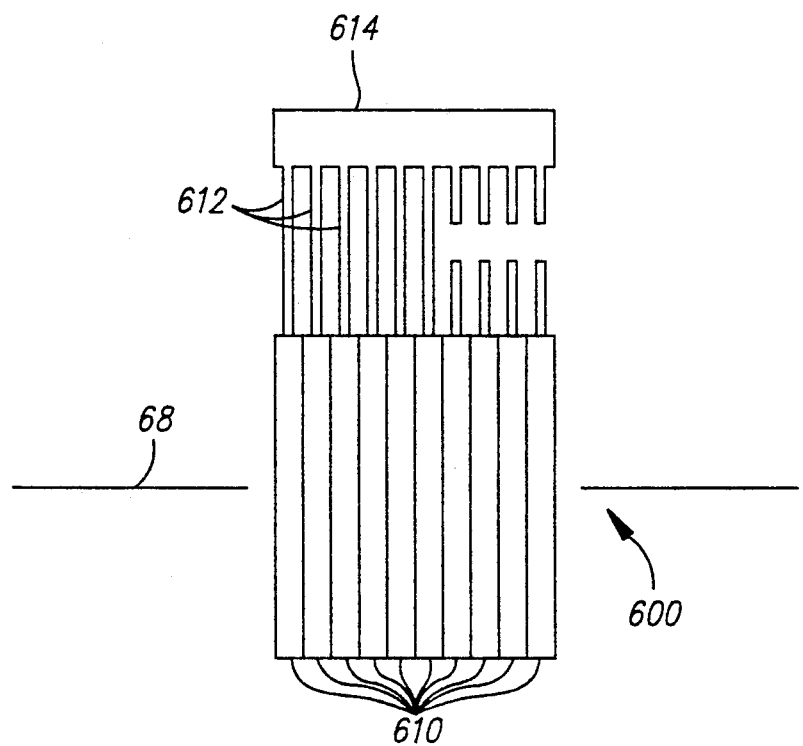
FIG. 21 is a top view of an optical detector of the present invention.

FIG. 21 shows a top view of an optical detector 600. Detector 600 is comprised of a plurality of individual optical detectors 610. Detectors 610 are shaped in long striped sections arranged in parallel. A series of individual leads 612 electrically connects each optical detector 610 to a common electrical lead 614. Detector 600 may be substituted for detectors 40 and 42 in the present invention and are oriented with respect to plane 68 as shown.

In the preceding embodiments, light from the lasers 20 and 22 were separately focussed to detectors 40 and 42. Relatively good alignment of the detectors during the manufacturing process is necessary. Detector 600 makes alignment of the detectors during manufacture easier.

The laser housing 18 is assembled with two detectors 600 used as detectors 40 and 42. Laser 20 is then energized and laser 22 is left off. Light is imaged from laser 20 to detector 40. However, some stray light from laser 20 may fall upon detector 42 also. Detector 42 is monitored and leads 612 are selectively severed until all of the sections 610 of detector 42 which receive this stray unwanted light from laser 20 are disconnected. The electrical leads 612 are severed by directing a powerful laser beam through the coverplate 16. The laser is highly focussed and can selectively melt each of the individual leads 612. Such laser devices for severing electronic leads are well known in the art. Laser 20 is then turned off and laser 22 is turned on. Light from laser 22 is imaged to detector 42 and some stray light may fall upon on detector 40. Leads 612 of detector 40 are selectively severed until all of the sections 610 of detector 40 which receive light from laser 22 are disconnected. The result is that detectors 40 and 42 will only detect the desired light from their respective lasers. Any misalignment which may occur during manufacture is thereby corrected.

Figure 22:
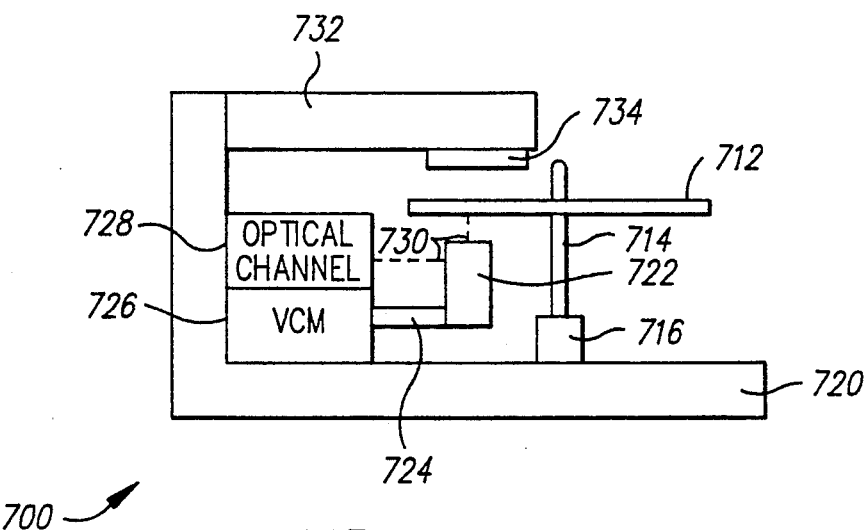
FIG. 22 is a schematic diagram of a DRAW system of the present invention.

FIG. 22 shows a schematic diagram of a DRAW optical data storage system of the present invention and is designated by the general reference number 700. System 700 includes an optical data storage disk 712. Disk 712 is preferably a magneto-optic type of disk. Disk 712 is mounted on a simple 714 which is attached to a spindle motor 716. Motor 716 is attached to a system chassis 720. Motor 716 rotates spindle 714 and disk 712.

An optical head 722 is positioned below disk 712. Head 722 is attached to an arm 724 which in turn is connected to a voice coil motor 726. Motor 726 is attached to chassis 720 and moves arm 724 and head 722 in a radial direction below disk 712. A dashed line 730 shows the path of light from an optical channel 728 to head 722 and disk 712 and back. A magnet arm 732 is connected to chassis 720 and extends over disk 712. A bias magnet 734 is mounted to arm 732.

Figure 23:
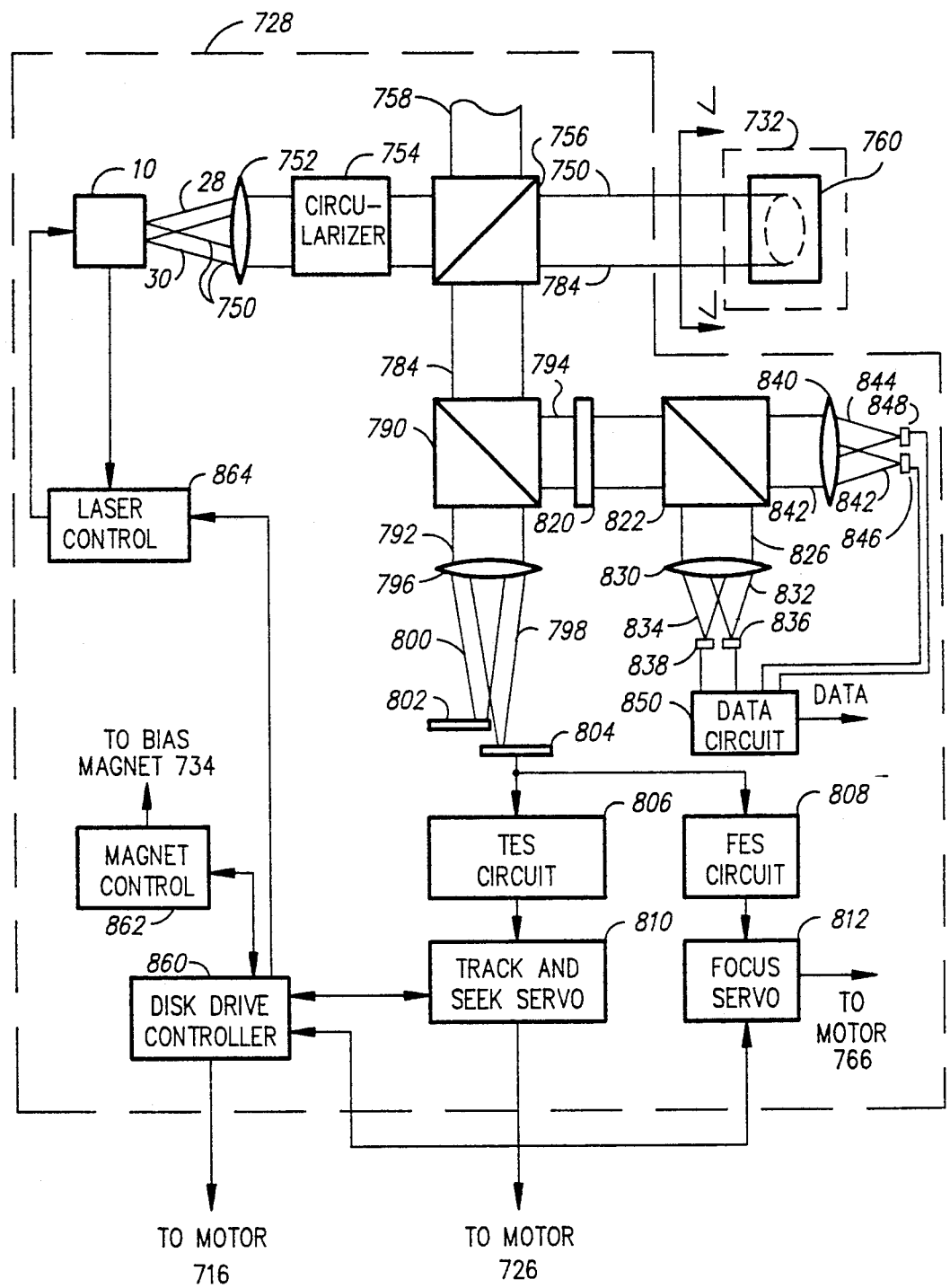
FIG. 23 is a schematic diagram of a portion of the system of FIG. 22.

FIG. 23 shows a schematic diagram of optical channel 728. Laser system 10 from FIG. 1 is used to produce a polarized Read/Write (R/W) beam 28 and a polarized direct read after write (DRAW) beam 30. Alternative embodiment systems 100, 200, 250, 300, 350, 400, 450, 500 or 550 may be substituted for system 10. The overlapping beams 28 and 30 will be referred to as a transmission beam 750. Beam 750 is collimated by a collimating lens 752 and circularized by a circularizer 754. Actually, because of their separate points of origin, beams 28 and 30 will be slightly offset in angle from each other after passing through lens 752. Circularizer 754 is preferably a prism assembly which is well known in the art. Beam 750 passes to a beamsplitter 756. A portion of beam 750 is directed away from beamsplitter 756 as beam 758 and is unused. The remaining portion of beam 750 passes to optical head 732. Head 732 has a beam bender mirror 760 oriented at a 45° angle such that beam 750 is directed upward and out of the surface of the page of FIG. 23.

Figure 24:
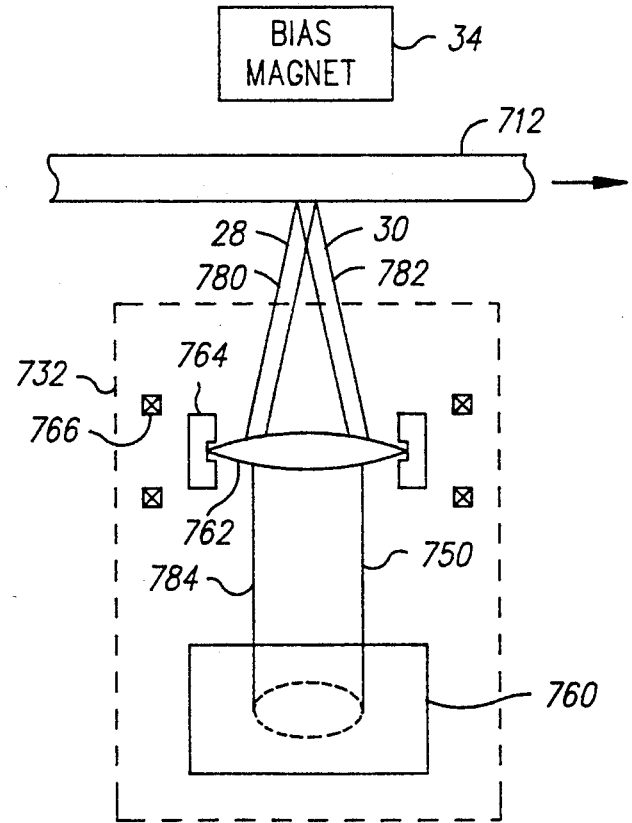
FIG. 24 is a schematic diagram of a portion of the system of FIG. 22.

FIG. 24 shows a side view of the optical head 732 from the perspective shown by the arrows in FIG. 23. The beam 750 is directed upwards from mirror 760 to a lens 762. Lens 762 is located in a holder 764 which is attached to a voice coil motor 766. Motor 766 moves lens 762 vertically up or down in order to focus the light onto the disk 712. At lens 762, the light beam 750 is divided back into the R/W beam 28 and the DRAW beam 30.

The beams 28 and 30 focus to the same track of disk 712. As disk 712 rotates in the direction of the arrow, the track is written by beam 28 and then verified by beam 30. Beams 28 and 30 are reflected by disk 712 as a reflected R/W beam 780 and a reflected DRAW beam 782. The overlapping beams 780 and 782 will be referred to as a reflected beam 784. The reflected beam 784 is collimated by lens 762 and is reflected by mirror 760.

See FIG. 23. Beam 784 passes through beamsplitter 756. At beamsplitter 756 a portion of beam 784 is reflected toward a beamsplitter 790. Beamsplitter 790 divides beam 784 into a servo beam 792 and a data beam 794. Servo beam 792 passes to a lens 796 which focuses and divides beam 792 into a R/W component beam 798 and a DRAW component beam 800. A knife edge 802 blocks beam 800. Beam 798 passes to a servo optical detector 804. Detector 804 may be a segmented spot size measuring detector as is known in the art. A tracking error circuit 806 and a focus error circuit 808 are connected to detector 804. Circuit 806 generates a tracking error signal which is used by a track and seek servo 810 to control motor 726 to keep the beams on track. Circuit 808 generates a focus error signal which is used by a focussing servo 812 to control motor 766 to move lens 762 in order to keep the beams focussed on the disk 712.

Data beam 794 passes through a half waveplate 820 to a polarizing beamsplitter 822. Beamsplitter 822 divides beam 794 into orthogonally polarized beams 824 and 826. A lens 830 focuses and divides beam 826 into a R/W component beam 832 and a DRAW component beam 834. Beams 832 and 834 fall upon a pair of optical detectors 836 and 838, respectively. A lens 840 focuses and divides beam 824 into a R/W component beam 842 and a DRAW beam 844. Beams 842 and 844 fall upon a pair of optical detectors 846 and 848, respectively. Detectors 836, 838, 846 and 848 are connected to a data circuit 850.

A disk controller 860, as is known in the art, provides overall system control. Controller 860 is connected to a magnet control 862, a laser control 864, motor 816 and servos 810 and 812 which are all known in the art. Laser control 864 is connected to lasers 20 and 22 and detectors 40 and 42 of system 10. Laser control 864 adjusts the power of lasers 20 and 22 as appropriate according to the level of power as monitored by the light received at detectors 40 and 42. For example, D. B. Carlin, et al., "Multichannel Optical Recording Using Monolithic Arrays of Diode Lasers," Applied Optics, Vol. 23, No. 24, Dec. 15, 1984, p. 4613; and S. Nakamuka, et al., "Compact Two Beam Head," Japanese Journal of Applied Physics, Vol. 26 (1987), p. 117, show such a laser control system.

While the invention has been particularly shown and described with reference to the preferred embodiments thereof, it will be understood by those skilled in the art that various other changes in form and detail may be made therein without departing from the spirit and scope of the invention.

What is claimed is:

1. A multiple beam optical system comprising:
   a plurality of radiation sources for producing overlapping radiation beams;
   a plurality of radiation detectors;
   a housing for supporting the sources and detectors, having a first side having a radiation permeable coverplate for passing a first portion of the overlapping radiation beams; and
   a radiation directing and focussing means proximate the first side of the housing for receiving a second portion of the overlapping radiation beams and separately focussing the beams to a separate one of the detectors.

2. The system of claim 1 wherein,
   the radiation directing and focussing means comprises a portion of an ellipsoidal surface.

3. The system of claim 1 wherein,
   the radiation directing and focussing means is comprised of ellipsoidal surfaces, each such surface having a first focus point at one of the radiation sources and a second focus point at one of the detectors.

4. The system of claim 1 wherein,
   the radiation directing and focussing means comprises a spherical surface.

5. The system of claim 1 wherein,
   the radiation directing and focussing means is comprised of a plurality spherical surfaces, each such surface located midway between one of the radiation sources and one of the detectors.

6. The system of claim 1 wherein,
   the radiation directing and focussing means is a hologram.

7. A multiple beam optical system comprising:
   a first laser;
   a second laser;
   a first optical detector;
   a second optical detector;
   a housing for supporting the first and second lasers and the first and second detectors, the housing having a light transparent coverplate for passing a central portion of the first and second light beams of the first and second lasers, respectively; and
   a light directing and focussing means attached to the coverplate for directing and focussing a peripheral portion of the first light beam to the first optical detector and for directing and focussing a peripheral portion of the second light beam to the second optical detector.

8. The system of claim 7 wherein,
   the light directing and focussing means is a focussing surface having a reflective coating.

9. The system of claim 7 wherein,
   the light directing and focussing means comprises a first and a second ellipsoidal surface located on an inside surface of the coverplate, the first ellipsoidal surface having a first focus point at the first laser and a second focus point at the first detector and the second ellipsoidal surface having a first focus point at the second laser and a second focus point at the second detector.

10. The system of claim 7 wherein,
    the light directing and focussing means comprises an ellipsoidal surface located on an inside surface of the coverplate and having a first focus point midway between the first and second lasers and a second focus midway between the first and second detectors.

11. The system of claim 7 wherein,
    the light directing and focussing means comprises a first and a second spherical surface located on an inside surface of the coverplate, the first spherical surface located midway between the first laser and the first detector and the second spherical surface located midway between the second laser and the second detector.

12. The system of claim 7 wherein,
    the light directing and focussing means comprises a spherical surface located on an inside surface of the coverplate midway between the midpoint between the first and second laser and the midpoint between the first and second detectors.

13. The system of claim 7 wherein,
    the light directing and focussing means comprises a first and a second ellipsoidal surface located on an outside surface of the coverplate, the first ellipsoidal surface having a first focus point at the first laser and a second focus point at the first detector and the second ellipsoidal surface having a first focus point at the second laser and a second focus point at the second detector.

14. The system of claim 7 wherein,
    the light directing and focussing means comprises an ellipsoidal surface located on an outside surface of the coverplate and having a first focus point midway between the first and second lasers and a second focus point midway between the first and second detectors.

15. The system of claim 7 wherein,
    the light directing and focussing means comprises a first and a second spherical surface located on an outside surface of the coverplate, the first spherical surface located midway between the first laser and the first detector and the second spherical surface located midway between the second laser and the second detector.

16. The system of claim 7 wherein,
    the light directing and focussing means comprises a spherical surface located on an outside surface of the coverplate midway between the midpoint between the first and second laser and a midpoint between first and second detector.

17. The system of claim 7 wherein,
    the light directing and focussing means comprises a hologram.

18. The system of claim 17 wherein,
    the hologram is a zoneplate hologram.

19. The system of claim 17 wherein,
    the hologram is located on an inside surface of the coverplate.

20. The system of claim 17 wherein,
    the hologram is located on an outside surface of the coverplate.

21. The system of claim 7 wherein,
    the first and second optical detectors are each comprised of a multi-sectional optical detector having severable leads.

22. A multiple beam optical system comprising:
    a first laser;
    a second laser;

a first optical detector;

a second optical detector;

a housing for supporting the first and second lasers and the first and second detectors, the housing having a light transparent coverplate for passing a central portion of the first and second light beams of the first and second lasers, respectively;

a light directing and focussing means attached to the coverplate for directing and focussing a peripheral portion of the first light beam to the first optical detector and for directing and focussing a peripheral portion of the second light beam to the second optical detector;

a laser control means connected to the first and second lasers and to the first and second optical detectors for controlling the power of the lasers in response to the light detected by the first and second optical detectors;

an optical data storage medium;

a transmission means for transmitting the central portion of the first and second light beams to the medium; and a reception means for receiving a reflected portion of the central portion of the first and second light beams from the medium and generating a data signal responsive thereto.

* * * * *